US011691880B2

(12) United States Patent
Lee et al.

(10) Patent No.: US 11,691,880 B2
(45) Date of Patent: Jul. 4, 2023

(54) METHOD FOR MANUFACTURING TWO-DIMENSIONAL MATERIAL USING TOP-DOWN METHOD

(71) Applicant: AJOU UNIVERSITY INDUSTRY-ACADEMIC COOPERATION FOUNDATION, Suwon-si (KR)

(72) Inventors: Jaehyun Lee, Bucheon-si (KR); Jiyun Moon, Yongin-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 113 days.

(21) Appl. No.: 17/388,600

(22) Filed: Jul. 29, 2021

(65) Prior Publication Data
US 2022/0033265 A1 Feb. 3, 2022

(30) Foreign Application Priority Data

Jul. 30, 2020 (KR) .................. 10-2020-0094941

(51) Int. Cl.
*C01B 32/194* (2017.01)
*C01B 32/19* (2017.01)
(Continued)

(52) U.S. Cl.
CPC ............ *C01B 32/194* (2017.08); *C01B 32/19* (2017.08); *C01G 39/06* (2013.01); *C30B 29/02* (2013.01);
(Continued)

(58) Field of Classification Search
CPC ... C01B 32/194; C01B 32/19; C01B 2204/02; C01B 19/007; C01B 21/0648; C01B 32/182; C01B 32/184; C01B 32/186; C01B 32/188; C01B 32/192; C01B 32/196; C01B 32/198; C01B 2204/00; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32; C01B 32/20;
(Continued)

(56) References Cited

U.S. PATENT DOCUMENTS

2012/0052415 A1* 3/2012 Fragala ................. B44B 5/02
430/296
2016/0318207 A1* 11/2016 Zaretski ............... C01B 32/194

OTHER PUBLICATIONS

Song, et al., Transfer Printing of Graphing Using Gold Film, ACS Nano 2009; 3(6); 1353-1356 (Year: 2009).*

* cited by examiner

*Primary Examiner* — Daniel C. McCracken
(74) *Attorney, Agent, or Firm* — Sughrue Mion, PLLC

(57) ABSTRACT

The present embodiments relate to a method for manufacturing a two-dimensional material using a top-down method, the method includes the steps of preparing a bulk crystal, forming a metal layer on the bulk crystal, and then attaching a thermal release tape on the metal layer, exfoliating a two-dimensional material to which the metal layer and the thermal release tape have been attached from the bulk crystal, transferring the two-dimensional material to which the metal layer and the thermal release tape have been attached onto a substrate, and removing the thermal release tape and the metal layer from the substrate onto which the two-dimensional material has been transferred.

6 Claims, 5 Drawing Sheets

(51) Int. Cl.
  *C01G 39/06*   (2006.01)
  *C30B 33/00*   (2006.01)
  *C30B 29/46*   (2006.01)
  *C30B 29/64*   (2006.01)
  *C30B 29/02*   (2006.01)
  *B82Y 40/00*   (2011.01)
  *B82Y 30/00*   (2011.01)

(52) U.S. Cl.
  CPC .............. *C30B 29/46* (2013.01); *C30B 29/64* (2013.01); *C30B 33/00* (2013.01); *B82Y 30/00* (2013.01); *B82Y 40/00* (2013.01); *C01B 2204/02* (2013.01)

(58) Field of Classification Search
  CPC ..... C01B 32/205; C01B 32/21; C01B 32/215; C01B 32/22; C01B 32/225; C01G 39/06; C01G 39/00; C30B 29/02; C30B 29/46; C30B 29/64; C30B 33/00; C30B 29/403; C30B 33/06; B82Y 30/00; B82Y 40/00; C01P 2004/02; C01P 2004/24; H01L 21/02612; H01L 21/02521; H01L 21/02587; B82B 3/0038
  See application file for complete search history.

[Figure 1]
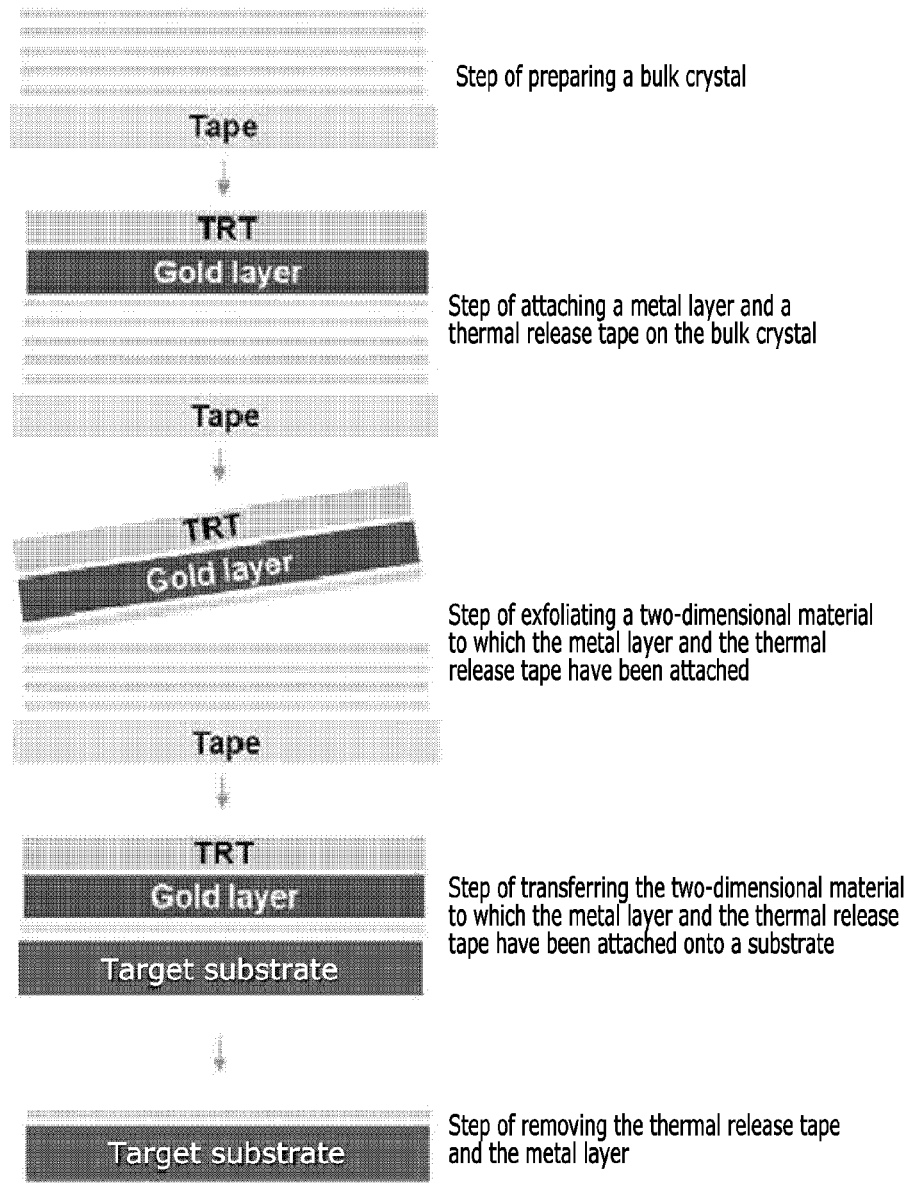

[Figure 2]
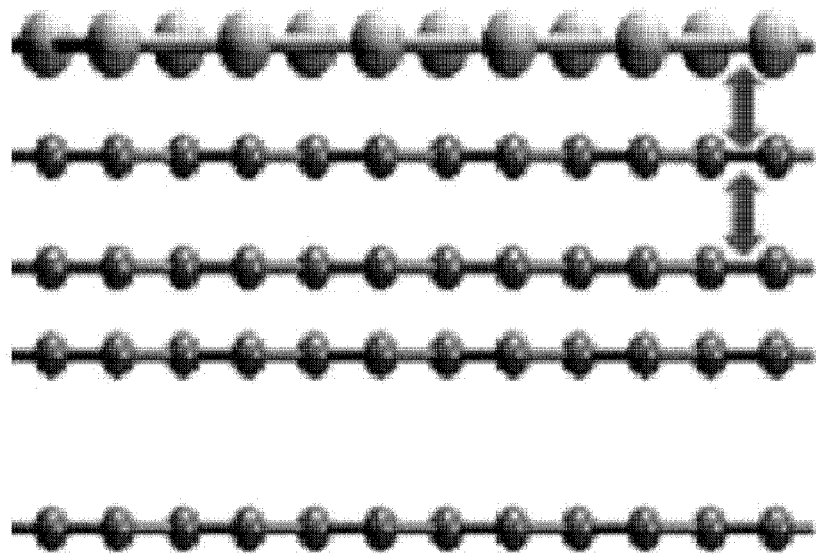
$\gamma^{2D-2D} \approx \gamma^{Gold-2D}$

[Figure 3]
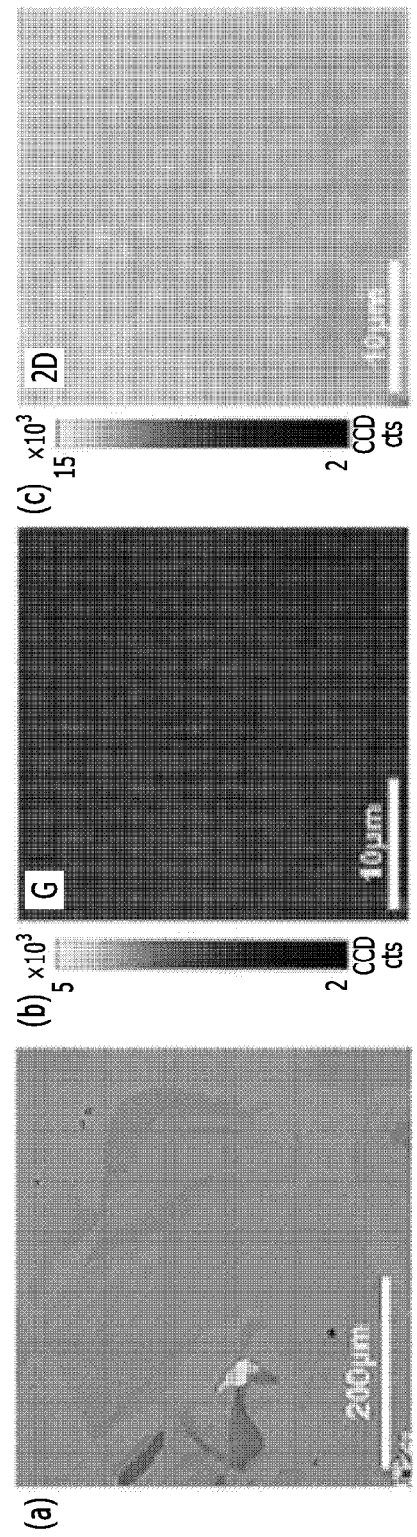

[Figure 4A]
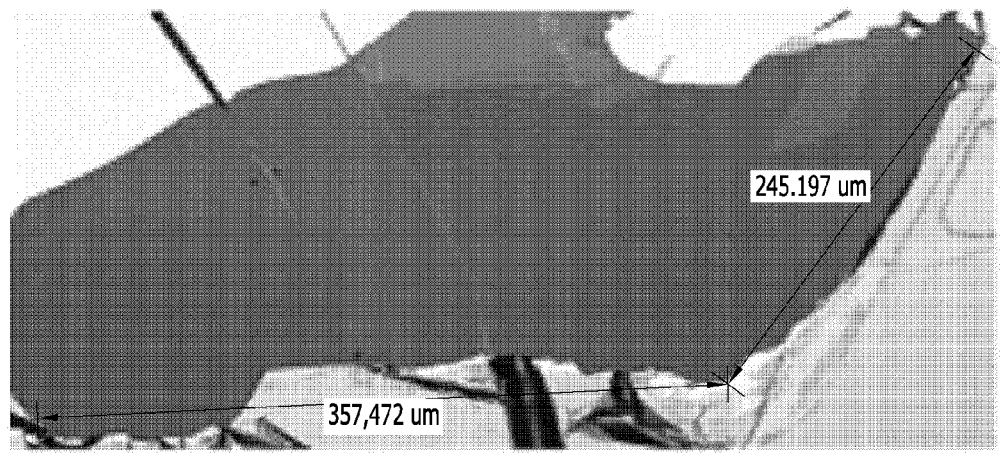

[Figure 4B]
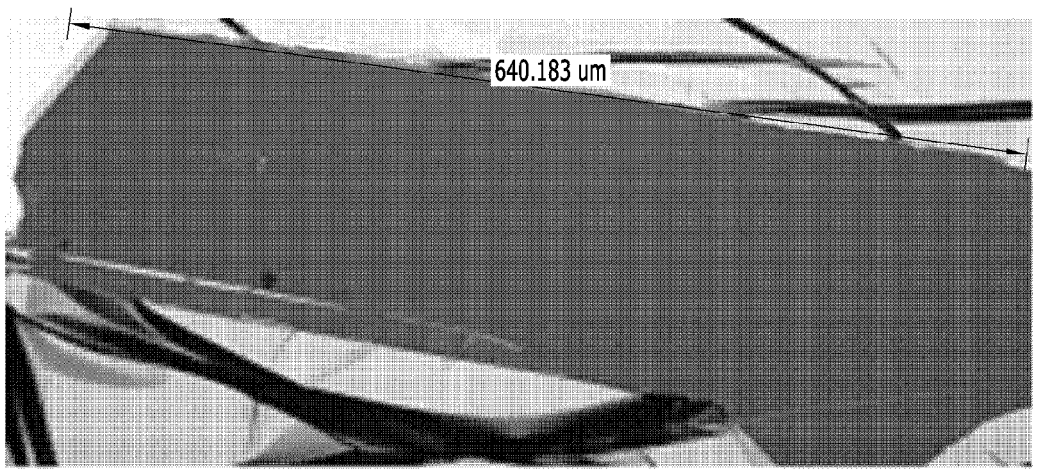

METHOD FOR MANUFACTURING TWO-DIMENSIONAL MATERIAL USING TOP-DOWN METHOD

CROSS-REFERENCE TO RELATED APPLICATIONS

This application claims the priority of Korean Patent Application No 10-2020-0094941 filed on Jul. 30, 2020, in the Korean Intellectual Property Office, the disclosure of which is incorporated herein by reference.

BACKGROUND

Field

The present embodiments relate to a method for manufacturing a two-dimensional material using a top-down method and, more particularly, to a method of separating a large area two-dimensional material from a bulk crystal using a metal layer.

Description of the Related Art

Although the industry of semiconductors which become components of high-tech devices, has rapidly grown over the past few decades, it has recently hit a limit as elements have been integrated. A method of applying a two-dimensional layered nanomaterial has been proposed as a method for solving this problem.

A two-dimensional material synthesis method which has been carried out so far is largely classified into a top-down method based on physical exfoliation and a bottom-up method based on a chemical synthesis method.

Chemical Vapor Deposition (CVD) is a representative example of a method of synthesizing a two-dimensional material by the chemical synthesis method.

However, a two-dimensional material synthesized through CVD has many defects and has a problem of exhibiting low crystallinity. Accordingly, although a method for manufacturing a two-dimensional material by a top-down method has been proposed, in the case of the top-down method, it is difficult to adjust the thickness of the two-dimensional material to be separated, and there is a problem that the area of a manufactured two-dimensional material is limited to several μm.

Therefore, the development of a technology capable of overcoming the limitations of an existing top-down method is required in order to secure a high quality two-dimensional material.

SUMMARY

The present embodiment is intended to provide a method of manufacturing a large area two-dimensional material to a desired thickness from a bulk crystal using a metal layer.

A method for manufacturing a two-dimensional material using a top-down method according to an embodiment may include the steps of preparing a bulk crystal, forming a metal layer on the bulk crystal, and then attaching a thermal release tape on the metal layer, exfoliating a two-dimensional material to which the metal layer and the thermal release tape have been attached from the bulk crystal, transferring the two-dimensional material to which the metal layer and the thermal release tape have been attached onto a substrate, and removing the thermal release tape and the metal layer from the substrate onto which the two-dimensional material has been transferred.

According to the present embodiments, a large area two-dimensional material of which thickness adjustment is easy, and which has a thickness level of nm may be easily manufactured. Further, a two-dimensional material manufactured according to the present embodiment has a low level and very excellent crystallinity.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 schematically shows a method for manufacturing a two-dimensional material using a top-down method according to an embodiment;

FIG. 2 is a schematic diagram showing a mechanism for exfoliating a monolayer two-dimensional material from a bulk crystal;

(a) of FIG. 3 is an optical image measured with respect to the monolayer graphene manufactured according to the present embodiment;

(b) and (c) of FIG. 3 are surface analysis results using Raman analysis for the monolayer graphene manufactured according to the present embodiment;

FIG. 4A is an optical image measured with respect to molybdenum diselenide ($MoSe_2$) prepared according to the present embodiment; and FIG. 4B is an optical image measured with respect to molybdenum disulfide ($MoS_2$) prepared according to the present embodiment.

DETAILED DESCRIPTION OF THE EMBODIMENT

The terminology used here is for the purpose of referring to specific embodiments only, and is not intended to limit the present disclosure. The singular forms used here also include the plural forms unless the phrases clearly indicate the opposite meaning. The meaning of "comprising" used in the specification specifies a particular characteristic, region, integer, step, operation, element and/or component, and does not exclude the existence or addition of another characteristic, region, integer, step, operation, element and/or component.

All terms including technical and scientific terms used here have the same meaning as commonly understood by those with ordinary skill in the art to which the present disclosure pertains. Further, unless otherwise specified, % means % by weight.

Hereinafter, embodiments of the present disclosure will be described in detail. However, this is presented as examples, the present disclosure is not limited thereby, and the present disclosure is only defined by the scope of the claims to be described later.

FIG. 1 schematically shows a method for manufacturing a two-dimensional material using a top-down method according to an embodiment.

Referring to FIG. 1, a method for manufacturing a two-dimensional material using a top-down method according to an embodiment may include the steps of preparing a bulk crystal, forming a metal layer on the bulk crystal, and then attaching a thermal release tape on the metal layer, exfoliating a two-dimensional material to which the metal layer and the thermal release tape have been attached from the bulk crystal, transferring the two-dimensional material to which the metal layer and the thermal release tape have been attached onto a substrate, and removing the thermal release tape and the metal layer from the substrate onto which the two-dimensional material has been transferred.

First, a bulk crystal is prepared.

FIG. 2 is a schematic diagram showing a mechanism for exfoliating a monolayer two-dimensional material from a bulk crystal.

Referring to FIG. 2, the binding energy between respective layers within the bulk crystal may be expressed as $\gamma^{2D-2D}$, and the binding energy between the bulk crystal and the metal layer may be expressed as $\gamma^{2D-metal}$.

In the present embodiment, the difference between a binding energy value between the respective layers within the bulk crystal, and a binding energy value between the bulk crystal and the metal layer may be 30 meV/atom or less, more specifically, more than 0 to not more than 30 meV/atom.

When the metal layer is formed on the bulk crystal, the number of layers of the two-dimensional material that may be peeled off from the bulk crystal is determined by a difference between the binding energy between the metal and the two-dimensional material and the binding energy between the respective layers within the bulk crystal.

According to the crack propagation theory, when $\gamma^{2D-metal} > \gamma^{2D-2D}$, multiple layers of a two-dimensional material are exfoliated, whereas in case of $\gamma^{2D-metal} \approx \gamma^{2D-2D}$, only one layer of the two-dimensional material may be selectively separated.

As described above, the present embodiment has a very similar value of 30 meV/atom or less as a difference between the binding energy between the respective layers within the bulk crystal, that is, the Van Der Waals energy, and the binding energy between the bulk crystal and the metal layer.

Therefore, it is possible to have monolayer selectivity with respect to the bulk crystal under the metal layer. Accordingly, since the two-dimensional material is directly exfoliated from the bulk crystal, a monolayer material having a large area similar to the size of the bulk crystal may be obtained.

Since this is a technology utilizing the energy intensity between the metal and the bulk crystal, the material of the bulk crystal to which the present embodiment may be applied is not particularly limited.

That is, in the present embodiment, although the bulk crystal may include, for example, at least one of graphite, transition metal dichalcogenide (TMD), hexagonal boron nitride (h-BN), and black phosphorus (BP), the present disclosure is not limited thereto.

Next, the metal layer may be formed using, for example, a metal including at least one of gold, silver, copper, iron, nickel, cobalt, aluminum, and palladium.

For example, when graphite is used as the bulk crystal, the metal layer may be formed using gold so that the binding energy between graphite and the metal layer has a binding energy that is similar to the van der Waals energy within graphite.

The step of forming the metal layer may be performed using at least one of thermal evaporation equipment and an Electron beam (E-beam) evaporator.

Next, a step of attaching a thermal release tape on the metal layer is performed. Metal and a two-dimensional material layer may be easily moved to a desired substrate by using the thermal release tape.

Thereafter, a step of exfoliating the two-dimensional material to which the metal layer and the thermal release tape have been attached from the bulk crystal is performed.

As described above, the exfoliation may be performed using a difference between the binding energy between the respective layers within the bulk crystal and the binding energy between the bulk crystal and the metal layer.

The exfoliated two-dimensional material may have an average thickness range of 0.3 nm to 1 nm. According to the present embodiment, it is possible to implement a monolayer two-dimensional material having a very thin average thickness as well as a large area.

Conventionally, when manufacturing a two-dimensional material using a top-down method, the area has been corresponded to several μm so that there has been a problem of having difficulty in applying the two-dimensional material to the semiconductor industry, etc. However, according to the present embodiment, since a two-dimensional material having an area of nm level may be manufactured, it has a very advantageous effect in that it may be applied to various industries requiring a thin film two-dimensional material.

Next, a step of transferring the two-dimensional material to which the metal layer and the thermal release tape have been attached onto a substrate is performed.

That is, the two-dimensional material to which the metal layer and the thermal release tape have been attached is transferred onto a desired target substrate. Thereafter, a step of removing the thermal release tape and the metal layer from the substrate onto which the two-dimensional material has been transferred is performed.

The removal of the thermal release tape may be performed by applying heat of, for example, 100° C. to 150° C.

Further, in order to remove organic contamination generated after removing the thermal release tape, organic solvents including, for example, acetone, hexane, chlorobenzene, chloroform, toluene, etc. may be used.

Next, the removal of the metal layer may be performed using, for example, at least one of a KI (potassium iodide), $I_2$ (iodine), HCl, $HNO_3$, and a gold etchant.

FIG. 3A shows an optical image measured with respect to the monolayer graphene manufactured according to the present embodiment, and (b) and (c) of FIG. 3 are surface analysis results using Raman analysis for the monolayer graphene manufactured according to the present embodiment.

Referring to FIG. 3A, it may be confirmed that graphene, which is a monolayer two-dimensional material, has been transferred onto a desired substrate without contamination.

Further, referring to (b) and (c) of FIG. 3, it is confirmed that the large-area graphene manufactured according to the present embodiment has an area that is increased by 2000 times or more compared to graphene manufactured by a general top-down method. In addition, as a result of surface analysis using Raman analysis, it is confirmed that high-quality characteristics are maintained without deterioration of quality in a large area of millimeter level.

FIG. 4A is an optical image measured with respect to molybdenum diselenide ($MoSe_2$) prepared according to the present embodiment, and FIG. 4B is an optical image measured with respect to molybdenum disulfide ($MoS_2$) prepared according to the present embodiment.

Referring to FIGS. 4A and 4B, it may be confirmed that the monolayer two-dimensional material has been transferred onto the desired substrate without contamination.

The present disclosure is not limited to the above embodiments, but may be implemented in various different forms, and those with ordinary skill in the art to which the present disclosure pertains will be able to understand that the present disclosure may be implemented in other specific forms without changing technical spirit or essential features of the present disclosure. Therefore, it should be understood that the embodiments described above are illustrative in all respects and not limited.

What is claimed is:

1. A method for manufacturing a two-dimensional material using a top-down method, the method comprising the steps of:
 preparing a bulk crystal including multiple layers, each of the multiple layers being formed of the two-dimensional material;
 forming a metal layer on the bulk crystal, and then attaching a thermal release tape on the metal layer;
 exfoliating only one layer of the two-dimensional material to which the metal layer and the thermal release tape have been attached from among the multiple layers in the bulk crystal;
 transferring the one layer of the two-dimensional material to which the metal layer and the thermal release tape have been attached onto a substrate; and
 removing the thermal release tape and the metal layer from the substrate onto which the two-dimensional material has been transferred,
 wherein in the step of exfoliating only the one layer of the two-dimensional material from among the multiple layers in the bulk crystal, a difference between a binding energy between the respective multiple layers in the bulk crystal and a binding energy between the bulk crystal and the metal layer is 30 meV/atom or less, and
 wherein the exfoliated one layer of two-dimensional material has an average thickness range of 0.3 nm to 1 nm.

2. The method of claim 1, wherein the bulk crystal includes at least one of graphite, transition metal dichalcogenide (TMD), hexagonal boron nitride (h-BN), and black phosphorus (BP).

3. The method of claim 1, wherein the metal layer is formed using a metal including at least one of gold, silver, copper, iron, nickel, cobalt, aluminum, and palladium.

4. The method of claim 1, wherein the step of forming the metal layer is performed by a deposition method using at least one of thermal evaporation equipment and an E-beam evaporator.

5. The method of claim 1, wherein, in the step of removing the thermal release tape and the metal layer, the removal of the thermal release tape is performed by applying heat of 100° C. to 150° C.

6. The method of claim 1, wherein, in the step of removing the thermal release tape and the metal layer, the removal of the metal layer is performed using at least one of a KI (potassium iodide), $I_2$ (iodine), HCl, $HNO_3$, and a gold etchant.

* * * * *